(12) United States Patent
Taniguchi et al.

(10) Patent No.: US 8,288,762 B2
(45) Date of Patent: Oct. 16, 2012

(54) ORGANIC FIELD EFFECT TRANSISTOR AND ITS PRODUCTION METHOD

(75) Inventors: Masateru Taniguchi, Suita (JP); Tomoji Kawai, Suita (JP); Hideyuki Kawaguchi, Suita (JP); Ikuo Fukui, Joetsu (JP)

(73) Assignees: Osaka University, Osaka (JP); Shin-Etsu Chemical Co., Ltd., Tokyo (JP)

( * ) Notice: Subject to any disclaimer, the term of this patent is extended or adjusted under 35 U.S.C. 154(b) by 182 days.

(21) Appl. No.: 12/551,205

(22) Filed: Aug. 31, 2009

(65) Prior Publication Data

US 2010/0051927 A1   Mar. 4, 2010

(30) Foreign Application Priority Data

Sep. 1, 2008   (JP) ................................. 2008-223369

(51) Int. Cl.
 *H01L 35/24* (2006.01)
(52) U.S. Cl. ................... 257/40; 257/E51.001
(58) Field of Classification Search .................... 257/40, 257/E51.001
See application file for complete search history.

(56) References Cited

U.S. PATENT DOCUMENTS

| | | | |
|---|---|---|---|
| 5,338,479 A | 8/1994 | Panandiker et al. | |
| 5,347,144 A | 9/1994 | Garnier et al. | |
| 2004/0222412 A1 | 11/2004 | Bai et al. | |
| 2005/0121668 A1* | 6/2005 | Lee et al. | 257/40 |
| 2008/0308791 A1* | 12/2008 | Taniguchi et al. | 257/40 |

FOREIGN PATENT DOCUMENTS

JP   5-508745 A   12/1993

OTHER PUBLICATIONS

Kawaguchi et al, "Control of device characteristics of ambipolar organic field-effect transistors using the hydroxyl in organic insulator," Synthetic Metals, 158, (2008), pp. 355-358.*

Kawaguchi et al., "Control of Device characteristics of Ambipolar Organic Field-Effect Transistors Using the Hydroxyl in Organic Insulator", Synthetic Metals, Elsevier Sequoia, Lausanne, Ch, vol. 158, No. 8-9, Jun. 1, 2008, pp. 355-358.

Yoon et al., "Low-Voltage Organic Field-Effect Transistors and Inverters Enabled by Ultrathin Cross-Linked Polymers as Gate Dielectrics", Journal of the American Chemical Society, American Chemical Society, Washington, DC, vol. 127, Jul. 27, 2005, pp. 10388-10395, XP002408788.

* cited by examiner

*Primary Examiner* — Anthony Ho
(74) *Attorney, Agent, or Firm* — Birch, Stewart, Kolasch & Birch, LLP

(57) ABSTRACT

An organic field effect transistor (OFET) having a structure of a conductor layer/an insulator layer/a semiconductor layer is provided. This OFET comprises an insulator layer formed by mixing a polymer compound produced by polymerizing or copolymerizing a monomer represented by the formula (1):

$$CH_2=CHCOO-(CH_2)_2-CN \quad (1)$$

and/or a monomer represented by the formula (2):

$$CH_2=C(CH_3)COO-(CH_2)_2-CN \quad (2)$$

with a polymerizable and/or crosslinkable organic compound other than the monomer represented by the formula (1) or (2); and a semiconductor layer comprising an organic compound.

6 Claims, 1 Drawing Sheet

ORGANIC FIELD EFFECT TRANSISTOR AND ITS PRODUCTION METHOD

CROSS-REFERENCE TO RELATED APPLICATION

This non-provisional application claims priority under 35 U.S.C. §119(a) on Patent Application No. 2008-223369 filed in Japan on Sep. 1, 2008, the entire contents of which are hereby incorporated by reference.

TECHNICAL FIELD

This invention relates to an organic field effect transistor (OFET) having a conductor layer/insulator layer/semiconductor layer structure, and in particular, an OFET used in a liquid crystal display, flexible display, IC tag, and the like. This invention also relates to a method for producing the OFET.

BACKGROUND ART

Conventional silicon semiconductor and thin layer field effect transistor (TFT) using a compound semiconductor are used not only in ordinary integrated circuits but also in widening range of applications. In particular, use of TFT in liquid crystal display is quite common, and with the recent increase in the size and definition of the liquid crystal display, an increasing number of TFT are used in the display corresponding to the increased number of the pixel.

However, in the case of conventional metal semiconductors that had been used, slight defects were inevitably formed on the TFT during the process of the patterning by photoresist or the like and the etching in the course of forming the circuit on the substrate. In addition, the production cost could be reduced only to a certain degree in the case of the TFT produced by such process. Other thin displays such as plasma display and organic EL display suffered from the same situation as long as they used the TFT.

The recent trend of the increased area and definition of the display naturally results in the increased incidence of the defects in the TFT product, and there is a strong demand for a method which is capable of minimizing the TFT defects.

In addition, the need for the process of the patterning by photoresist and the etching limited the reduction of the production cost.

On the other hand, there are widening new applications for the silicon semiconductor having the MIS (metal/insulator/semiconductor) structure and the TFT using the compound semiconductor, and further reduction in the price and flexibility of the device have been requested. Exemplary such applications include IC tag, flexible display, printable integrated circuit, and electronic paper, and in order to correspond to these new applications, use of organic insulator and organic semiconductor has been attempted since such organic materials can be produced at a reduced cost, and they have various functional properties such as flexibility enabling their use for various type of device. However, not much is known for the organic insulator material. For example, JP-A 5-508745 describes that a device prepared by using an insulator organic polymer having a relative dielectric constant of at least 5 for the insulator layer and a polycondugated organic compound having a weight average molecular weight of up to 2,000 for the a semiconductor layer has the field effect and a mobility of about $10^{-2}$ $cm^2 V^{-1} s^{-1}$. However, α-sexithienyl is used for the organic semiconductor material and formation of the semiconductor layer by vapor deposition is required, and the process of the patterning by photoresist and the etching is still required, and this makes the cost reduction difficult.

SUMMARY OF THE INVENTION

The present invention has been completed in view of the situation as described above, and an object of the present invention is to provide an OFET having a structure of a conductor layer/an insulator layer/a semiconductor layer and produced by using an organic material, wherein the conventional circuit formation technique used in the metal semiconductor and the insulator, namely, the process such as patterning by photoresist or the like and etching has been replaced by printing technique by using an organic substance which is soluble in an organic solvent, namely, a polymer substance for the materials of the semiconductor layer and the insulator layer, to thereby enable reduction of the incidence of the defects in the TFT for a liquid crystal display as described above as well as reduction of the production cost, and also, to thereby produce, an OFET wherein the threshold voltage is as low as about several volts which is equivalent to the ordinary amorphous silicon. Another object of the present invention is to provide a method for producing such OFET.

The inventors of the present invention have made an intensive study to attain the objects as described above, and found that an OFET which can be operated at a low voltage equivalent to that of the ordinary amorphous silicon can be produced by a relatively simple method when the insulator layer is formed by using a mixed system of a polymer having a high relative dielectric constant and which does not have hydroxyl group and a polymerizable and/or crosslinkable organic compound other than such polymer for forming the insulator layer. The present invention has been completed on the bases of such findings.

Accordingly, the present invention provides the organic field effect transistor and its production method as described below.

[1] An organic field effect transistor having a structure of a conductor layer/an insulator layer/a semiconductor layer; wherein the transistor comprises an insulator layer formed by mixing (i) a polymer compound produced by polymerizing or copolymerizing a monomer represented by the formula (1):

$$CH_2=CHCOO-(CH_2)_2-CN \quad (1),$$

and/or a monomer represented by the formula (2):

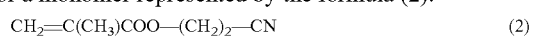

$$CH_2=C(CH_3)COO-(CH_2)_2-CN \quad (2)$$

and (ii) a polymerizable and/or crosslinkable organic compound other than the monomer represented by the formula (1) or (2); and a semiconductor layer comprising an organic compound.

[2] The organic field effect transistor according to the above [1] wherein molar ratio of the monomer represented by the formula (1) to the monomer represented by the formula (2) is in the range of 100:0 to 50:50.

[3] The organic field effect transistor according to the above [1] or [2] wherein the substance constituting the semiconductor layer is an organic compound which is soluble in an organic solvent and has a weight average molecular weight in excess of 2,000 and up to 1,000,000.

[4] The organic field effect transistor according to the above [3] wherein the substance constituting the semiconductor layer is a polythiophene.

[5] The organic field effect transistor according to any one of the above [1] to [4] wherein the polymerizable and/or crosslinkable organic compound other than the monomer represented by the formula (1) or (2) is an isocyanate.

[6] The organic field effect transistor according to the above [5] wherein the isocyanate is a crosslinkable alicyclic polyisocyanate.

[7] A method for producing an organic field effect transistor having a gate electrode comprising a conductor layer, an insulator layer, and a semiconductor layer comprising the steps of forming an insulator layer by coating and curing a solution for forming the insulator layer on the gate electrode composed of the conductor layer, said solution comprising a solution in an organic solvent of (i) a polymer produced by polymerizing or copolymerizing a monomer represented by the formula (1):

$$CH_2=CHCOO-(CH_2)_2-CN \qquad (1)$$

and/or a monomer represented by the formula (2):

$$CH_2=C(CH_3)COO-(CH_2)_2-CN \qquad (2)$$

and (ii) a polymerizable and/or crosslinkable organic compound other than the monomer represented by the formula (1) or (2); and disposing thereon the semiconductor layer.

[8] The method according to the above [7] wherein molar ratio of the monomer represented by the formula (1) to the monomer represented by the formula (2) is in the range of 100:0 to 50:50.

[9] The method according to the above [7] or [8] wherein the substance constituting the semiconductor layer is an organic compound which is soluble in an organic solvent and has a weight average molecular weight in excess of 2,000 and up to 1,000,000.

[10] The method according to the above [9] wherein the substance constituting the semiconductor layer is a polythiophene.

[11] The method according to any one of the above [7] to [10] wherein the polymerizable and/or crosslinkable organic compound other than the monomer represented by the formula (1) or (2) is an isocyanate.

[12] The method according to the above [11] wherein the isocyanate is a crosslinkable alicyclic polyisocyanate.

Advantageous Effects of Invention

The present invention is capable of producing an OFET having a structure of a conductor layer/an insulator layer/a semiconductor layer, which can be operated at a low voltage equivalent to the ordinary amorphous silicon can be produced by forming the insulator layer using a mixed system of a polymer having a high relative dielectric constant and which does not have hydroxyl group and a polymerizable and/or crosslinkable organic compound other than such polymer for forming the insulator layer.

In addition, in the conventional circuit formation technology used in silicon semiconductors and inorganic semiconductors, a process such as patterning by photoresist or the like and etching was necessary. In contrast, the present invention has enabled a production by a solvent process, and the production can be readily accomplished by using ink jet and other printing technologies, and this leads to the reduced incidence of the defect on the circuit as well as the reduced production cost.

DESCRIPTION OF EMBODIMENTS

Figure 1:
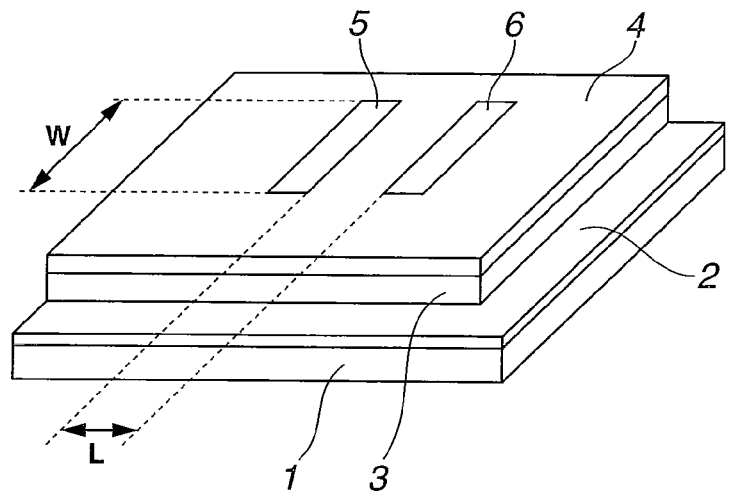
FIG. 1 is a perspective view showing one embodiment of the present invention.

The OFET of the present invention may have a structure as shown in FIG. 1, and it may comprise a substrate 1, a conductor layer 2 which functions as a gate electrode, an insulator layer 3 formed on the conductor layer 2, a semiconductor layer 4 on the insulator layer 3, and a source electrode 5 and a drain electrode 6 formed on the semiconductor layer 4. The substrate may be composed of $SiO_2$ or a glass substrate as well as a sheet of a polymer such as polyethylene terephthalate, polycarbonate, or polyimide.

In this case, the commonly used ITO (indium tin oxide) film or a single metal such as Au, Cu, or Al, or a metal laminate such as Au/Ti, Cu/Ti, or Al/Ti deposited by physical vapor deposition or metal organic chemical vapor deposition (MOCVD) may be used for the conductor layer. However, use of an electroconductive paste is preferable as long as its use has no practical problem since formation by printing is more adequate in view of the object of the present invention. Exemplary electroconductive pastes include electroconductive carbon black paste such as Ketjen Black and electroconductive metal pastes such as silver paste, as well as organometallic compound inks such as silver ink using a silver organic compound which can be metalized at a relatively low temperature.

In the OFET of the present invention, the first component which forms the insulator layer is a polymer compound produced by polymerizing or copolymerizing a monomer represented by the formula (1):

$$CH_2=CHCOO-(CH_2)_2-CN \qquad (1)$$

and/or a monomer represented by the formula (2):

$$CH_2=C(CH_3)COO-(CH_2)_2-CN \qquad (2).$$

This polymer compound is soluble in an organic solvent, and it preferably has a viscosity of 30 to 8,000 mPa·s at 20° C. when dissolved in dimethylformamide at 20% by weight. This viscosity is the value measured by using a rotary viscometer.

More specifically, the polymer compound is either a homopolymer of the monomer represented by the formula (1), namely, 2-cyanoethyl acrylate or the monomer represented by the formula (2), namely, 2-cyanoethyl methacrylate, which is soluble in a solvent such as dimethylformamide; or a copolymer of these two monomers.

These polymer compounds may be synthesized through radical polymerization of such monomer by using a radical polymerization initiator. The radical polymerization initiator may be any agent commonly used in the art, and examples include azo polymerization initiators such as 2,2'-azobisisobutyronitrile, 2,2'-azobis(2,4-dimethylvaleronitrile), and 2,2'-azobis-2-methylbutyronitrile, and peroxide catalysts such as benzoyl peroxide. The polymer compound of the present invention should have cyano group in its molecular structure, and therefore, the radical polymerization initiator is most preferably an azo polymerization initiator having nitrile group. The polymerization initiator is preferably added at a molar amount of 0.005 to 0.02 in relation to the total molar amount of the monomer. When the polymer is added at an amount less than such amount, the progress of the polymerization may be insufficient due to, for example, inactivation of the radical. Excessive addition, on the other hand, results in the difficulty of controlling the polymerization reaction, and also, in the excessively high degree of polymerization of the resulting polymer compound, and this may lead to insolubility of the polymer compound as well as other difficulty in its subsequent use.

A chain transfer agent such as lauryl mercaptan may also be used to control the polymerization reaction. In this case, the chain transfer agent may be used at a molar amount of 0.05 to 1.0 in relation to the molar amount of the polymerization initiator. When the chain transfer agent is used at an amount less than such range, control of the polymerization reaction may become difficult depending on the amount of the initiator, while amount in excess of such range may result in the insufficient polymerization reaction.

The polymerization may be conducted by the method commonly known in the art such as bulk polymerization, solution polymerization, suspension polymerization, and emulsion polymerization. In the case of the solution polymerization, the solvent used in the polymerization is not particularly limited as long as it can dissolve the monomer without inhibiting the polymerization, and exemplary such solvents include acetone, N,N'-dimethylformamide, esters, and ethers. In view of the purification after the polymerization, the solvent used is preferably the one having miscibility with the crystallization solvent and miscibility with water, and the preferred solvents include acetone and N,N'-dimethylformamide.

The monomer is also not particularly limited for its concentration in the polymerization solvent. The concentration, however, is preferably at least 10% by weight because the polymerization will be insufficient when the monomer concentration in the polymerization solvent is excessively low. The polymerization will be bulk polymerization in the absence of the use of the polymerization solvent.

The homopolymer of the 2-cyanoethyl acrylate represented by the formula (1) has the tendency of high relative dielectric constant and low softening temperature, and on the other hand, the homopolymer of the 2-cyanoethyl methacrylate of the formula (2) has the tendency of low relative dielectric constant and high softening temperature compared to the homopolymer of the 2-cyanoethyl acrylate represented by the formula (1). When the 2-cyanoethyl acrylate of the formula (1) and the 2-cyanoethyl methacrylate of the formula (2) are compared as a monomer, 2-cyanoethyl acrylate has content in the molecule of the dipolar group, namely, the cyanoethyl group higher than that of the 2-cyanoethyl methacrylate, and this results in the difference of the relative dielectric constant. In the meanwhile, when the acrylate homopolymer and the methacrylate homopolymer are compared for the softening temperature, it is well known that the methacrylate homopolymer has higher softening temperature, it is the same for the polymers of the cyanoethyl monomers.

Examples of the polymerizable and/or crosslinkable organic compound other than the monomer represented by the formula (1) or (2) include acrylate compounds such as methyl (meth)acrylate; vinyl compounds such as styrene and vinyl acetate; and isocyanate compounds. The polymerizable and/or crosslinkable organic compound, however, is not particularly limited as long as it is polymerizable and/or crosslinkable, and two or more such compounds may be used in combination. In view of forming the insulator layer by the polymerization and/or crosslinking without any post-treatment, the polymerizable and/or crosslinkable organic compound is preferably the one which can be polymerized and/or crosslinked by UV irradiation, heating, or the like without using any special catalyst, and exemplary such compounds include, in particular, blocked polyisocyanates. When heated, the blocked polyisocyanate produces active isocyanate compound by releasing the blocking agent. Exemplary blocked polyisocyanates include reaction product of a polyisocyanate compound such as tolylene diisocyanate, methaphenylene diisocyanate, diphenylmethane diisocyanate, hexamethylene diisocyanate, trimethylhexamethylene diisocyanate, isophorone diisocyanate, dicyclohexylmethane hexamethylene diisocyanate, or triphenylmethane triisocyanate with a blocking agent such as a phenol compound such as phenol, cresol, or resorcin, a lactam such as ∈-caprolactam or valerolactam, an oxime such as acetoxime, methyl ethyl ketone oxime, or cyclohexane oxime, or ethyleneimine; and the preferred are thermosetting one-component compound such as an alicyclic polyisocyanate and isophorone diisocyanate blocked with an oxime.

The OFET of the present invention is believed to function by the channel enhancement realized by orientation of the cyanoethyl group which is the dipolar group in the polymer compound which is the first component constituting the insulator layer of the present invention at the boundary between the insulator layer and the semiconductor layer when the electrical potential is applied to the gate. Accordingly, it is postulated that a higher relative dielectric constant corresponds to a higher performance including the mobility. It is also believed that the polymer compound which is the first component constituting the insulator layer of the present invention does not have a functional group such as hydroxy group, and therefore, this polymer does not react with the polymerizable and/or crosslinkable organic compound which is the second component constituting the insulator layer of the present invention, and accordingly, the insulator layer presumably has a microdomain structure comprising the second component and the first component which have independently polymerized and/or crosslinked by themselves.

In addition, the first component constituting the insulator layer may not show stable performance when the softening temperature is too low due to the softening of the insulator layer by the increase in the temperature during the operation. Accordingly, the molar ratio of the monomer of the formula (1) to the monomer of the formula (2) in the copolymer of the monomer of the formula (1) and the monomer of the formula (2) is preferably 100:0 to 50:50, and more preferably 90:10 to 50:50. When the molar ratio of the monomer of the formula (2) is higher than such range, the flexibility at the boundary or the relative dielectric constant may prove insufficient due to the increase in the softening temperature.

The ratio (weight ratio) of the first component and the second component forming the insulator layer is preferably in the range of 95:5 to 50:50, and more preferably 90:10 to 50:50. When the ratio is lower than such range, the merit of operating the OFET at a low voltage may not be realized while the ratio higher than such range may result in the decrease of the effects realized by the dipolar group as described above.

In the OFET of the present invention, the substance constituting the semiconductor layer is an organic compound, and examples of such organic compound include pentacenes, metal phthalocyanines such as copper phthalocyanine and iron phthalocyanine, low molecular weight compounds such as α-sexithienyl, and high molecular weight compounds such as polythiophenes, polypyrroles, polyanilines, poly acetylenes, polythienylene vinylenes, and polyphenylene vinylenes. When the organic compound is a high molecular weight compound, the preferred are those which are soluble in an organic solvent and having an average molecular weight in excess of 2,000 and up to 1,000,000 in terms of polystyrene when measured by GPC, for example, polythiophenes, poly pyrroles, polyanilines, polyacetylenes, polythienylene vinylenes, and polyphenylene vinylenes. In view of the solubility in the organic solvent and good workability, the preferred are polythiophenes such as poly(3-hexylthiophene).

When the substance used for forming the semiconductor layer is a low molecular weight compound, the semiconductor layer may be formed on the insulator layer by a method commonly used in the art such as vacuum deposition. When the substance used for forming the semiconductor layer is a substance soluble in an organic solvent whether it is a low molecular weight compound or a high molecular weight compound, the semiconductor layer may be formed on the insulator layer by coating the solution followed by drying. In this case, however, the substance used for forming the semiconductor layer should be dissolved in an organic solvent in which the insulator layer is not soluble because the boundary between the semiconductor layer and the insulator layer would otherwise be uneven.

As described above, the OFET of the present invention may be produced by depositing the organic semiconductor layer on the organic insulator layer by vapor deposition, or by preparing a solution in an organic solvent of the organic semiconductor material and a solution in an organic solvent of the organic insulator material and coating and drying each solution. The preferred is the coating method due to the simplicity of the method. In this case, exemplary organic solvents which may be used for dissolving the compound for the insulator layer include N-methyl-2-pyrrolidone, N,N'-dimethylformamide, acetone, acetonitrile, and γ-butyl lactone, and the preferred are solvents which can dissolve both the first component and the second component for forming the insulator layer. On the other hand, exemplary organic solvents which may be used for dissolving the high molecular weight compound for the semiconductor layer include chloroform, toluene, hexane, and alcohol. In both cases, the solvents as mentioned above may be used alone or in combination of two or more.

More specifically, a solution for forming the insulator layer comprising a solution of the polymer obtained by polymerizing or copolymerizing the monomer represented by the formula (1) and/or the monomer represented by the formula (2) and the polymerizable and/or crosslinkable organic compound other than the monomer represented by the formula (1) or (2) in an organic solvent is coated on the gate electrode comprising the conductor layer, dried, and cured to form the insulator layer; and a solution of the organic compound for forming the semiconductor layer in an organic solvent in which the insulator layer is insoluble is coated on the insulator layer, and dried to form the semiconductor layer. For example, the conductor layer which functions as the gate electrode is formed by sputtering on a substrate composed of $SiO_2$, a glass or a polymer sheet commonly used in the art; or an electroconductive paste, an electroconductive macromolecule, an organometallic compound ink, or the like may be coated by spin coating, screen printing, ink jet printing, or the like and dried to form the conductor layer on such substrate. A glass having ITO film which is readily available may also be used for the gate electrode.

The solution for forming the insulator layer comprising a solution in an organic solvent of the first component and the second component of the insulator layer is then coated on the thus formed gate electrode by spin coating, screen printing, or ink jet printing, and the coating is cured under predetermined curing conditions by photo-curing using UV or thermal curing to form the insulator layer.

Then, the solution of the organic compound for forming the semiconductor layer in an organic solvent in which the insulator layer is insoluble is coated on the insulator layer by spin coating, screen printing, or ink jet printing, and the coating is dried to for the semiconductor layer.

Finally, the source and the drain electrodes are formed on the semiconductor layer by sputtering or by coating an electroconductive paste, an electroconductive macromolecule, an organometallic compound ink, or the like by screen printing or ink jet printing, followed by drying.

The OFET of the present invention may have a so-called top contact structure comprising a conductor layer functioning as a gate electrode, an insulator layer formed on the gate electrode, a semiconductor layer on the insulator layer, and a source electrode and a drain electrode on the semiconductor layer, while it may also have a bottom contact structure, and the OFET is not particularly limited for its structure. The OFET of the present invention functions by the formation of electroconductive area (namely, the so-called channel) in the semiconductor layer by the electric charge formed in the semiconductor layer near the insulator layer by the field effect due to the electric field formed by the electrical potential applied to the gate. Accordingly, the boundary between the insulator layer and the semiconductor layer is very important, and a smoother boundary is preferable.

The insulator layer may preferably have a thickness of 0.1 to 10 μm, and in particular, 0.1 to 0.3 μm. The semiconductor layer may preferably have a thickness of 50 to 300 nm, and in particular, 50 to 100 nm. The conductor layer may preferably have a thickness of 30 to 50 nm, and the thickness is not limited for such range.

EXAMPLES

Next, the present invention is described in further detail by referring to Example and Comparative Example, which by no means limit the scope of the present invention.

Example 1

A three necked flask (500 ml) equipped with a condenser and a stirrer was purged with nitrogen, and 70 g of 2-cyanoethyl acrylate monomer which had been distilled by conventional distillation at reduced pressure was added. Next, 163 g of dehydrated acetone (a polymerization solvent), 2,2'-azobisisobutyronitrile (a radical initiator) at a molar ratio of 0.01 to the momoner, and 0.001 mole of laurylmercaptane (chain transfer agent) were added. Nitrogen inlet tube was connected, and the reaction was allowed to proceed at a reaction temperature of 60° C. for a reaction time of 300 minutes. After the completion of the reaction, the reaction mixture was cooled to room temperature, and the reaction mixture was added to an excessive amount of methanol to collect the precipitate. The precipitate was dissolved in acetone, and the precipitation in the excessive amount of methanol was repeated. The purified precipitate was dried to obtain about 63 g of poly(2-cyanoethyl acrylate) which had a viscosity of 305 mPa·s at 20° C. when dissolved in dimethylformamide at 20% by weight, a relative dielectric constant at 40° C./1 kHz of about 11, and a softening temperature of about 30° C.

In forming the insulator layer, the poly(2-cyanoethyl acrylate) prepared as described above was used for the first component and an oxime block isophorone diisocyanate (VESTANAT B1358/100 manufactured by Degussa) was used for the second component, and a solution was prepared by using the first component and the second component at a weight ratio of 2:1 and dissolving the first and the second components in N-methyl-2-pyrrolidone so that these components constitute 20% by weight of the solution. The solution was filtered through a 0.2 μm membrane filter, and this solution was used as the solution in an organic solvent for forming the insulator layer. Copper phthalocyanine (manufactured by ALDRICH) was used for the formation of the semiconductor layer, and an organic field effect transistor was prepared by the procedure as described below for evaluation.

Aluminum was deposited on a polyimide film (Upilex-S manufactured by Ube Industries, Ltd. having a thickness of 125 μm) to a thickness of 30 nm by RF sputtering at room temperature and a back pressure of $10^{-4}$ Pa to form a gate electrode. Water was then coated on the aluminum film, and the aluminum film was oxidized at 180° C. for 15 seconds to thereby form a thin aluminum oxide layer on the surface of the aluminum gate electrode.

Next, the solution for forming the insulator layer was applied to the aluminum gate electrode having the aluminum oxide thin layer on its surface by spin coating at 5,000 rpm for 60 seconds. The coating was heated at 180° C. for 24 hours to thereby evaporate the solvent and cure the coating to form an insulator layer having thickness of 0.3 μm.

Next, a semiconductor layer having a thickness of 50 nm was formed by vapor deposition of the copper phthalocyanine.

The substrate was then cooled to −20° C., and by using a metal mask, gold was applied on the semiconductor layer to 40 nm by vapor deposition by RF sputtering at a back pressure of up to $5 \times 10^{-4}$ Pa. The distance between the source electrode and the drain electrode (L in FIG. 1) was 50 μm, and the width of the electrode (W in FIG. 1) was 4.0 mm.

The thus produced organic field effect transistor was evaluated at a vacuum of up to $1.3 \times 10^{-3}$ Pa and in the shade.

Figure 2:
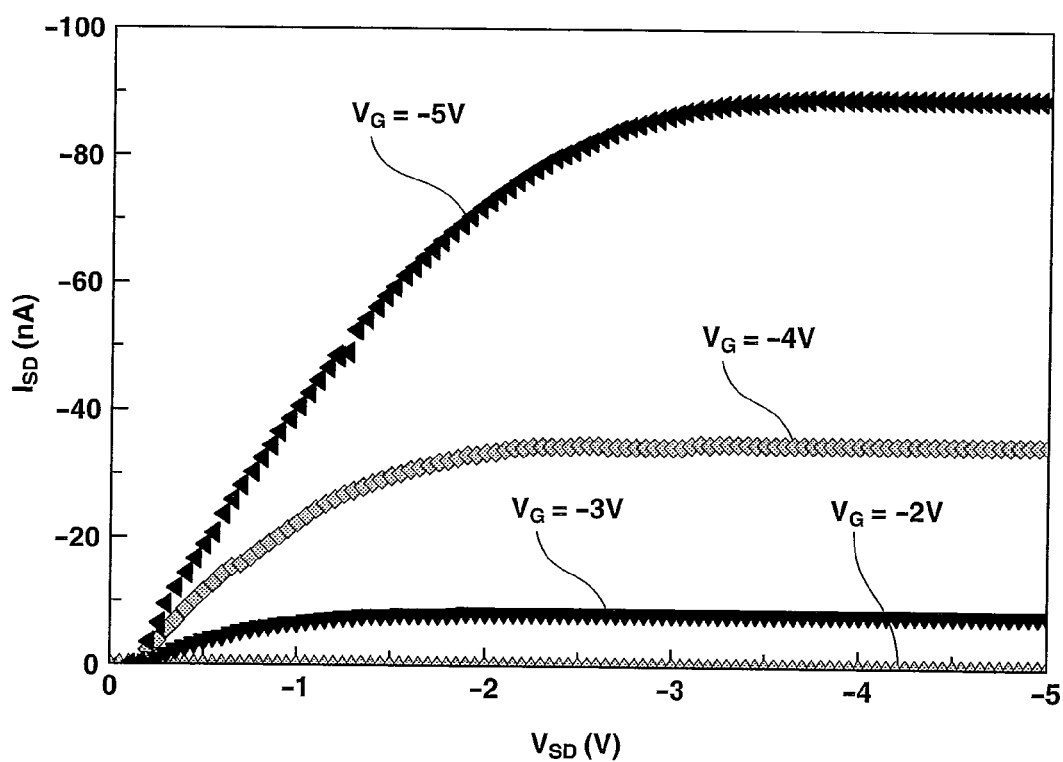
FIG. 2 is a graph showing the $I_{SD}$-$V_{SD}$ property of the OFET of the present invention of the Example 1.

More specifically, a negative gate voltage was applied to the thus produced organic field effect transistor to measure the current versus voltage ($I_{SD}$-$V_{SD}$) characteristics at room temperature (25° C.). Characteristics typical for the p-type transistor were observed, and as shown in FIG. 2, the current increased with the increase in the gate voltage.

Next, mobility (μ) was estimated from the channel conductance of the source-drain current versus source-drain voltage curve. The mobility was estimated to be $2.0 \times 10^{-3}$ cm$^2$/V$_s$, and the threshold voltage VT was −2.7 V, and the transistor can be operated at a low voltage of up to 5 V which is equivalent to the ordinary amorphous silicon.

Japanese Patent Application No. 2008-223369 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An organic field effect transistor having a structure of a conductor layer/an insulator layer/a semiconductor layer; wherein the transistor comprises an insulator layer formed by mixing (i) a polymer compound produced by polymerizing or copolymerizing a monomer represented by the formula (1):

$$CH_2=CHCOO-(CH_2)_2-CN \qquad (1),$$

and/or a monomer represented by the formula (2):

$$CH_2=C(CH_3)COO-(CH_2)_2-CN \qquad (2)$$

and (ii) a polymerizable and/or crosslinkable organic compound other than the monomer represented by the formula (1) or (2); and a semiconductor layer comprising an organic compound.

2. The organic field effect transistor according to claim 1 wherein molar ratio of the monomer represented by the formula (1) to the monomer represented by the formula (2) is in the range of 100:0 to 50:50.

3. The organic field effect transistor according to claim 1 wherein the substance constituting the semiconductor layer is an organic compound which is soluble in an organic solvent and has a weight average molecular weight in excess of 2,000 and up to 1,000,000.

4. The organic field effect transistor according to claim 3 wherein the substance constituting the semiconductor layer is a polythiophene.

5. The organic field effect transistor according to claim 1 wherein the polymerizable and/or crosslinkable organic compound other than the monomer represented by the formula (1) or (2) is an isocyanate.

6. The organic field effect transistor according to claim 5 wherein the isocyanate is a crosslinkable alicyclic polyisocyanate.

* * * * *